United States Patent [19]

Ahladas et al.

[11] Patent Number: 5,204,633

[45] Date of Patent: Apr. 20, 1993

[54] ELECTROMAGNETIC CONTACTOR WITH CLOSURE FAULT INDICATOR

[75] Inventors: Steven J. Ahladas, Highland; Edward J. Seminaro, Milton, both of N.Y.

[73] Assignee: International Business Machines Corporation, Armonk, N.Y.

[21] Appl. No.: 841,127

[22] Filed: Feb. 25, 1992

[51] Int. Cl.$^5$ .................. G01R 31/06; G08B 21/00; H02H 3/26

[52] U.S. Cl. .................. 324/654; 324/207.16; 324/207.24; 324/418; 324/656; 340/643; 340/664; 361/87; 361/187

[58] Field of Search .................. 324/207.16, 654–657, 324/236, 418, 546, 422, 423, 424; 361/83, 159, 160, 203, 93, 187; 340/644, 664, 643

[56] References Cited

U.S. PATENT DOCUMENTS

| | | | |
|---|---|---|---|
| 3,771,050 | 11/1973 | Golahny et al. | 324/654 X |
| 3,938,100 | 2/1976 | Steiner | 340/172.5 |
| 4,074,185 | 2/1978 | Dardenne | 324/654 X |
| 4,291,356 | 9/1981 | Mathieu | 361/87 |
| 4,292,658 | 9/1981 | Locher | 361/93 |
| 4,376,297 | 3/1983 | Anderson et al. | 364/200 |
| 4,538,203 | 8/1985 | Flanner et al. | 361/159 |
| 4,649,341 | 3/1987 | Ulbrich et al. | 324/654 X |
| 4,706,561 | 11/1987 | Greer | 324/654 X |
| 4,851,959 | 7/1989 | Stumpf | 361/203 |
| 4,859,942 | 8/1989 | Charton et al. | 324/654 X |
| 4,905,121 | 2/1990 | Uetsuhara et al. | 361/159 |
| 4,907,901 | 3/1990 | Mitchell | 324/207.16 X |
| 4,941,348 | 7/1990 | Hock | 324/654 X |
| 4,950,985 | 8/1990 | Voss et al. | 324/655 X |

*Primary Examiner*—Gerard R. Strecker
*Assistant Examiner*—Warren S. Edmonds
*Attorney, Agent, or Firm*—Mark S. Walker

[57] ABSTRACT

An electromagnetic contactor assembly with a sensing circuit for determining contactor state based upon the reluctance of the contactor coil. The coil has an electromagnetic coil and a movable contact separated from the coil by a gap when the coil is not energized. Energizing the coil causes the movable contact to close the gap and contact the coil. The determination of the relationship between the reluctance in the coil when the gap is in an open and closed state allows contactor gap status to be measured by measuring the coil inductance. A sensing circuit is added to the drive circuit to measure changes in AC current during the pulse cycle which holds the contacts in this closed position. The sensing circuit measures the AC current and is able to signal contactor status based on that value.

2 Claims, 2 Drawing Sheets

ELECTROMAGNETIC CONTACTOR WITH CLOSURE FAULT INDICATOR

BACKGROUND OF THE INVENTION

1. Field of the Invention

The present invention relates to electromagnetic contactors for making and breaking a circuit. In particular, the invention relates to an electromagnetic contactor that has the ability to detect contactor condition through a sensing circuit indicating contactor status.

2. Background of the Invention

Electromagnetic contactors are used in a variety of applications where it is desired that a circuit be made or broken in response to an electric signal. An example application is the use of power contactors in computer systems.

Although contactors are generally reliable, there is frequently a need to verify that contacts have actually been closed in response to the electric signal. Certain failures of the circuit or of the contactor components could result in a failure to close. Fault isolation and diagnosis require a means of sensing the position of the contacts of the contactor assembly to determine their response to a closure signal.

Contactor manufacturers have addressed this need for closure verification by adding a mechanical switch to contactors that is activated by contactor closure. For example, a tab can be located on the power contactor moving contacts and that tab can strike a mechanical switch mounted on the same body as the contactor forming a mechanically closed circuit. A fault isolation or diagnosis circuit can be used to test the status of mechanical switches to verify operation of contactors in response to signals.

The use of mechanical switches increases manufacturing cost and reduces reliability. Mechanical switches are costly to manufacture and install in conjunction with the contactors. In addition, because the switches are mechanical, they are subject to failure due to repeated use. Thus, the use of mechanical switches can lead to diagnostic failures caused by the switch as well as by a contactor failure.

Some manufacturers have suggested mechanisms for sensing the closure of electromagnetic contactors by sensing the wave forms generated by the closure movement. Systems of this type have the disadvantage that they can sense only the movement of the closure and cannot sense the steady state position of the contactors.

SUMMARY OF THE INVENTION

The present invention is directed to providing a mechanism for sensing contactor closure and contact position without the use of mechanical switches. The invention senses contact closure by measuring the reluctance of the electromagnetic core that causes the contacts to close. The present invention provides a sensing circuit for detecting the reluctance of the coil and for signalling this value to necessary diagnostic circuits.

It is therefore an object of the present invention to provide a contactor closure sensing circuit that uses no mechanical side switches. It is a further object of the invention to provide a circuit that uses the coil drive signal to sense core status. Finally, it is an object of the present invention to provide a closure sensing circuit that detects actual state as opposed to changes in state.

These and other objects of the present invention will become more apparent when taken in conjunction with the following description and drawings wherein like parts are designated by like reference numerals.

DESCRIPTION OF THE PREFERRED EMBODIMENT

Figure 1:
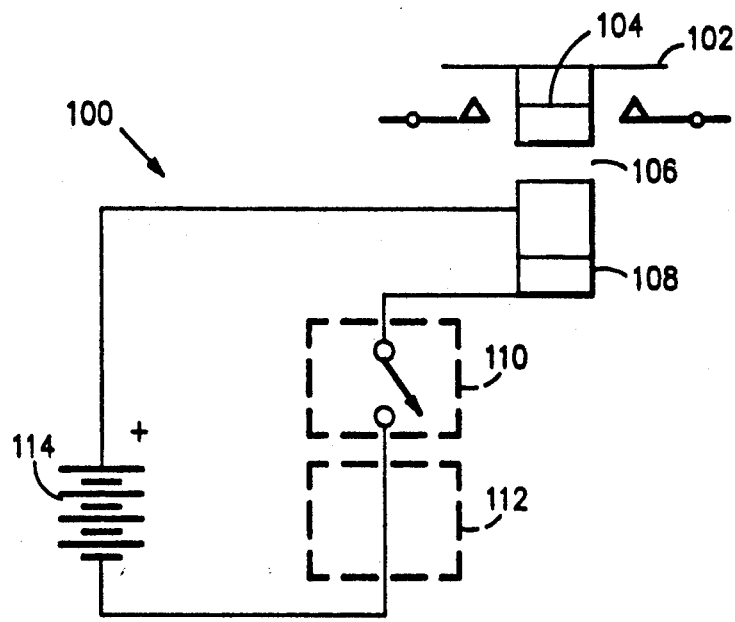
FIG. 1 is a schematic diagram of a contactor incorporating the present invention.

A schematic diagram of the circuit embodying the present invention is shown in FIG. 1. Contactor assembly is shown generally at 100. The assembly comprises a coil 108 and a moveable portion of the electromagnet 104. Upon receipt of a signal, drive circuit 110 applies the full power of power supply 114 to coil 108 causing the closure of the power contacts of contactor 102. The drive circuit switches to a low duty cycle, high frequency pulsing mode after a brief delay to allow the contacts to close. For example, in the preferred embodiment, 80 watts of power is applied for 100 milliseconds to close the contacts. The low duty cycle operates at 10% power, pulsing 8 watts at a frequency of 2 kilohertz. A pulsing mode is used because less energy is required to hold the contacts in place than is required to initially close them.

Contactor air gap 106 is relatively large when the contactor is in an open state and is essentially eliminated when the contacts are closed. Sensing circuit 112 is provided in the present invention to sense the reluctance of the electromagnetic coil and to provide that signal as required to other circuit elements. Sensing circuit 112 senses the reluctance in the core assembly comprising coil 108, moveable electromagnetic portion 104, and air gap 106. The characteristics of the drive circuit, the resulting reluctance values, and the sensing circuit will be described in further detail below.

The pulsing mode of drive circuit 110 causes the voltage across coil 108 to be a square wave. The resistance and inductance of the coil cause the current through the coil to be a DC value with a triangle wave superimposed upon it. This DC value is inversely proportional to the coil resistance and the magnitude of the AC portion (triangle wave) is inversely proportional to the coil inductance.

The reluctance of the core assembly can be calculated based upon the core cross section, the mean length of the path through the core and air gap, and the magnetic permeability of the core and air gap. The reluctance is given by the following equation:

$$\text{Reluctance} = \frac{\frac{D_{air}}{M_{air}} + \frac{D_{core}}{M_{core}}}{A}$$

Where:
 A is the cross section of the core
 $D_{air}$ and $D_{core}$ are the mean paths through the air gap and core respectively; and $M_{air}$ and $M_{core}$ are the permeabilities of the air and core respectively.

The magnetic permeability of the core is typically 1,000 times the permeability of air. Coil inductance can be expressed as a function of the reluctance, i.e.

Coil Inductance = K1/reluctance where K1 is a constant of the coil. Substituting for reluctance yields.

Coil Inductance = K2/ ($D_{air}+D_{core}$/1,000)

where Kb 2 is a constant involving K1, A, and $M_{air}$. When the contacts are closed, the mean path through the air gap, $D_{air}$, is zero and the inductance reduces to K2 $D_{core}$/1,000. A typical contactor will have a mean path through the core that is approximately 20 times the mean path through the air gap when the contacts are open. Making these substitutions the above equations can be reduced to:

Coil Inductance (closed) = 50 K2/$D_{air}$

Coil Inductance (open) = 0.98 K2/$D_{air}$

The coil inductance changes significantly between the open and closed states of the coil as shown by the above equations. Since the coil is driven by a known square wave by drive circuit 110, the inductance of the coil may be measured by analyzing the AC portion of that current wave form. The AC current through the coil will be significantly greater when the power contacts are open. By knowing the inductance of the coil in its open and closed states, contact closure can be sensed by measuring the coil current in sensor circuit 112.

Figure 2:
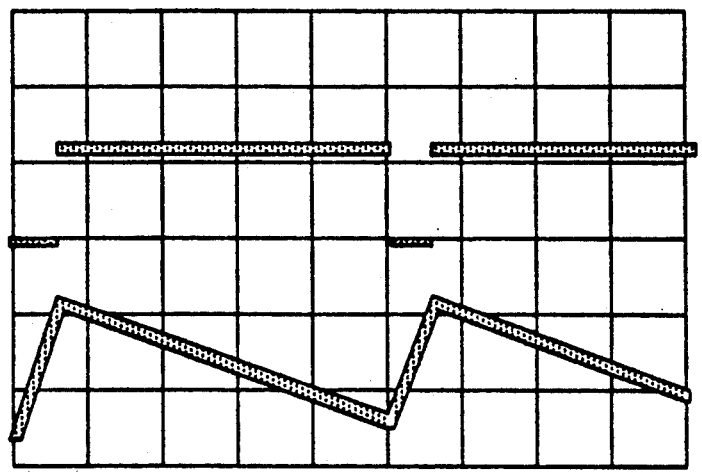
FIG. 2 is an example of the signal wave forms sensed when the contacts of a contactor are open.
Figure 3:
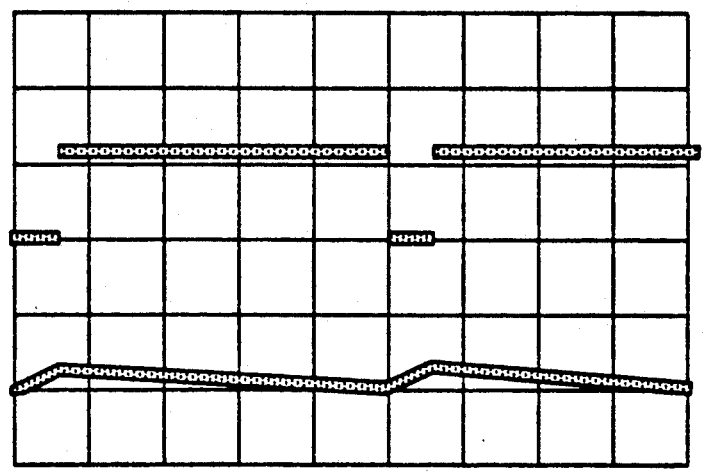
FIG. 3 is an example of the signal wave forms sensed when the contacts of a contactor are closed.

The AC current in the open state will appear as shown in FIG. 2. In this example, the peak AC current is approximately 60 mA. The AC current when the contacts are closed is shown in FIG. 3, where the peak AC current is approximately 10mA. The design of a circuit to sense these large variations in AC current is well known in the art.

Figure 4:
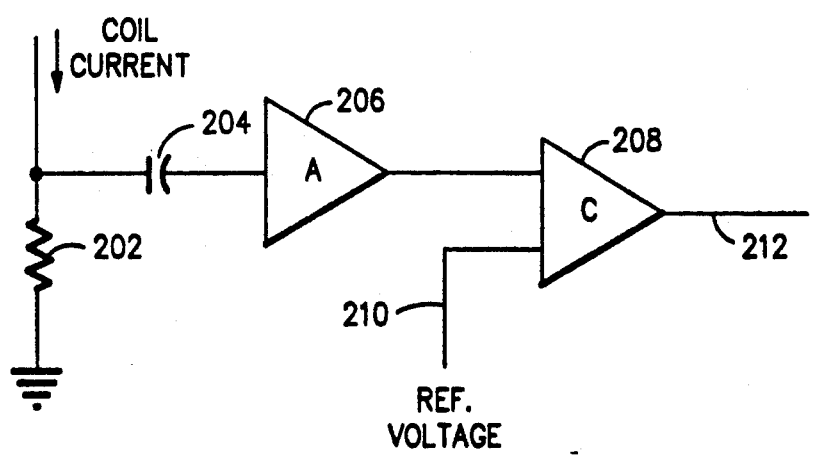
FIG. 4 is a schematic diagram of an example circuit for sensing contact closure.

FIG. 4 illustrates a simplified current sensor circuit 112. Current sense resistor 202 is connected so that the coil current flows through that resistor. One side of AC coupling capacitor 204 is connected to the circuit at a point between drive current 110 and current sense resistor 202. The other side of AC coupling capacitor 204 is connected to amplifier 206 that amplifies the signal. Amplifier 206 is connected in turn to one lead of comparator 208. The other lead of comparator 208 is connected to reference voltage source 210. Output signal 212 is generated as a result of comparing the amplified current sense signal to the reference voltage. The value of output signal 212 indicates whether the contents are open or closed.

The above description of the preferred embodiment has been provided only as an example. It will be recognized by those skilled in the art that many changes or modifications can be made and these are deemed to be within the scope of the invention. The scope of the invention is intended to be limited only by the following claims:

We claim:

1. An electromagnetic actuator having a contact closure sensing ability, said actuator comprising:
   an electromagnet having a movable core, and a fixed portion including a coil;
   said core movably disposed adjacent said fixed portion and operating to complete a circuit in response to the coil being energized, wherein the distance between said core and said fixed portion is significantly reduced when said coil is energized;
   a drive circuit electrically connected to said coil for energizing said coil at a first power level to move said movable core into contact with said fixed portion varying power level to maintain said contact; and
   sensor means electrically connected in series with said drive circuit for sensing contact by measuring a change in inductance of said coil between non-energized and energized states wherein said sensor means measures AC current amplitude flowing through said drive circuit and signals contact failure when said current amplitude is above a set value.

2. An apparatus comprising:
   an electromagnet having a movable core, and a fixed portion, a coil,
   means for applying an electrical potential to said coil,
   drive circuit means for regulating application of said electrical potential to said coil, said drive circuit generating a first power level for moving said movable core into contact with said fixed portion, and generating a second alternating power level for maintaining said core and fixed portion positions;
   said drive circuit means connected in electrical series with said coil and said means for applying an electrical potential,
   said movable core disposed adjacent to said coil, said movable core being magnetically attracted to said fixed portion and significantly reducing the distance therebetween when an electrical potential is applied to said coil;
   current sensor means for sensing alternating current in said drive circuit, said current sensor means connected in electrical series to said drive circuit; and
   current comparator means connected to said current sensor means for signalling when current falls below a set value.

* * * * *